United States Patent
Baba et al.

(10) Patent No.: US 9,257,721 B2
(45) Date of Patent: Feb. 9, 2016

(54) METHOD FOR MANUFACTURING ALL SOLID-STATE LITHIUM-ION RECHARGEABLE BATTERY, AND METHOD FOR TESTING ALL SOLID-STATE LITHIUM-ION RECHARGEABLE BATTERY

(75) Inventors: Mamoru Baba, Morioka (JP); Rongbin Ye, Morioka (JP); Masashi Kikuchi, Chigasaki (JP)

(73) Assignee: Mamoru Baba (JP)

( * ) Notice: Subject to any disclaimer, the term of this patent is extended or adjusted under 35 U.S.C. 154(b) by 225 days.

(21) Appl. No.: 13/997,958

(22) PCT Filed: Dec. 26, 2011

(86) PCT No.: PCT/JP2011/080058
§ 371 (c)(1),
(2), (4) Date: Sep. 9, 2013

(87) PCT Pub. No.: WO2012/090930
PCT Pub. Date: Jul. 5, 2012

(65) Prior Publication Data
US 2013/0341205 A1    Dec. 26, 2013

(30) Foreign Application Priority Data

Dec. 27, 2010 (JP) ................. 2010-290977

(51) Int. Cl.
*H01M 10/44* (2006.01)
*H01M 10/0525* (2010.01)
(Continued)

(52) U.S. Cl.
CPC .......... *H01M 10/058* (2013.01); *H01M 4/0438* (2013.01); *H01M 4/139* (2013.01); *H01M 10/0436* (2013.01); *H01M 10/052* (2013.01);
(Continued)

(58) Field of Classification Search
CPC ............... H01M 10/0525; H01M 10/0562; H01M 10/052; H01M 10/446; G01R 31/025
USPC .......................................... 205/799; 429/322
See application file for complete search history.

(56) References Cited

U.S. PATENT DOCUMENTS

| 5,677,086 A | 10/1997 | Satoh et al. |
| 5,824,284 A | 10/1998 | Satoh |

(Continued)

FOREIGN PATENT DOCUMENTS

| CN | 101246978 A | | 8/2008 |
| CN | 101246978 A | * | 8/2008 |

(Continued)

OTHER PUBLICATIONS

"Japanese Application Serial No. 2010-290977, Office Action mailed Jan. 20, 2015", (w/ English Translation), 3 pgs.

(Continued)

*Primary Examiner* — Nicholas A Smith
(74) *Attorney, Agent, or Firm* — Schwegman Lundberg & Woessner, P.A.

(57) ABSTRACT

A method for manufacturing an all solid-state lithium-ion rechargeable battery includes forming a first active material layer on a base, forming a solid electrolyte layer connected to the first active material layer, forming a second active material layer connected to the solid electrolyte layer, and repairing a short-circuit defect produced between the first active material layer and the second active material layer by supplying a repair current between the first active material layer and the second active material layer.

10 Claims, 3 Drawing Sheets

(51) Int. Cl.
- *H01M 10/058* (2010.01)
- *H01M 4/04* (2006.01)
- *H01M 4/139* (2010.01)
- *H01M 10/04* (2006.01)
- *H01M 10/052* (2010.01)
- *H01M 10/0562* (2010.01)
- *H01M 10/0565* (2010.01)
- *H01M 10/0585* (2010.01)
- *G01R 31/02* (2006.01)
- *G01R 31/36* (2006.01)

(52) U.S. Cl.
CPC ...... *H01M 10/0562* (2013.01); *H01M 10/0565* (2013.01); *H01M 10/0585* (2013.01); *H01M 10/446* (2013.01); *G01R 31/025* (2013.01); *G01R 31/3665* (2013.01); *Y02E 60/122* (2013.01)

(56) References Cited

U.S. PATENT DOCUMENTS

| | | | |
|---|---|---|---|
| 6,982,132 B1 * | 1/2006 | Goldner et al. | 429/162 |
| 2004/0106046 A1 | 6/2004 | Inda | |
| 2006/0234130 A1 | 10/2006 | Inda | |
| 2007/0259271 A1 | 11/2007 | Nanno et al. | |
| 2008/0311480 A1 | 12/2008 | Sano | |
| 2009/0274832 A1 | 11/2009 | Inda | |
| 2010/0201321 A1 | 8/2010 | Asakura et al. | |
| 2010/0297479 A1 | 11/2010 | Tsuchida et al. | |
| 2015/0047767 A1 | 2/2015 | Sano | |

FOREIGN PATENT DOCUMENTS

| | | |
|---|---|---|
| CN | 101276941 A | 10/2008 |
| CN | 101765940 A | 6/2010 |
| CN | 101834234 A | 9/2010 |
| JP | 2000-028690 A | 1/2000 |
| JP | 2000-030747 A | 1/2000 |
| JP | 2002-075468 A | 3/2002 |
| JP | 2002-352864 A | 12/2002 |
| JP | 2003-338277 A | 11/2003 |
| JP | 2004-088868 A | 3/2004 |
| JP | 2004-183078 A | 7/2004 |
| JP | 2007-005279 A | 1/2007 |
| JP | 2007-115598 A | 5/2007 |
| JP | 2009-049005 A | 3/2009 |
| JP | 2009-193727 A | 8/2009 |
| JP | 2009-272050 A | 11/2009 |
| JP | 2011-142016 A | 7/2011 |
| TW | 249302 B | 6/1995 |
| TW | 447155 B | 7/2001 |
| TW | 550846 B | 9/2003 |
| TW | I265652 B | 11/2006 |
| WO | WO-99/63609 A1 | 12/1999 |

OTHER PUBLICATIONS

"International Application Serial No. PCT/JP2011/080058, International Preliminary Report on Patentability dated Jul. 2, 2013", (w/ English Translation), 11 pgs.

"International Application Serial No. PCT/JP2011/080058, Written Opinion mailed Apr. 10, 2012", (w/ English Translation), 9 pgs.

"International Application Serial No. PCT/JP2011/080058, International Search Report mailed Apr. 10, 2012", (w/ English Translation), 5 pgs.

"Chinese Application Serial No. 201180062830.1, Office Action mailed Apr. 9, 2015", (w/ English Translation), 11 pgs.

"Taiwanese Application Serial No. 100148863, Office Action mailed Apr. 24, 2015", (w/ English Translation of Examination Opinion), 5 pgs.

* cited by examiner

Fig.6 methods for Manufacturing All Solid-State Lithium-Ion Rechargeable Battery, and Method for Testing All Solid-State Lithium-Ion Rechargeable Battery

RELATED APPLICATIONS

This application is a nationalization under 35 U.S.C. 371 from International Patent Application Serial No. PCT/JP2011/080058, filed Dec. 26, 2011, which claims the priority benefit of Japanese Patent Application No. 2010-290977, filed Dec. 27, 2010, the contents of which applications and publication are incorporated herein by reference in their entirety.

TECHNICAL FIELD

The present invention relates to a method for manufacturing an all-solid state lithium-ion rechargeable battery, and to method for testing an all solid-state lithium-ion rechargeable battery.

BACKGROUND ART

All-solid state lithium-ion rechargeable batteries have become popular because they are small, light, and have high energy density. An all solid-state lithium-ion rechargeable battery includes, on a substrate, a positive electrode collector layer, a negative electrode collector layer, a positive electrode active material layer, a solid electrolyte layer, and a negative electrode active material layer. These layers are formed by performing a sputtering process or a CVD process (for example, refer to patent document 1). Various types of printing processes may also be performed to form the layers.

PRIOR ART DOCUMENT

Patent Document 1: Japanese Laid-Open Patent Publication No. 2007-5279

SUMMARY OF THE INVENTION

When performing such processes to form each layer, a certain amount of particles is usually produced. When the particles enter the layers and the space between the layers, defects such as pinholes and microscopic cracks may be formed nearby. When such a defect is formed, the positive electrode collector layer and the negative electrode collector layer become electrically connected through the defective portion. A short-circuit results in loss of battery functions and thereby lowers the yield.

Further, for example, when a lower collector layer includes a protuberance, since each layer stacked between two collector layers is a thin film of several micrometers or smaller, the protuberance may come into contact with an upper collector layer. The protuberance may cause short-circuiting.

Such a short-circuiting defect may be caused by a factor other than the factors described above because each layer is a thin film. Accordingly, it is strongly desired that the yield be unaffected by such short-circuiting defects.

Accordingly, it is an object of the present invention to provide a method for manufacturing an all solid-state lithium-ion rechargeable battery that allows for the yield to be unaffected by short-circuiting defects, and to a method for testing an all solid-state lithium-ion rechargeable battery.

One aspect of the present invention is a method for manufacturing an all solid-state lithium-ion rechargeable battery. The manufacturing method of the present invention includes a first active material layer formation step of forming a first active material layer on a base, an electrolyte layer formation step of forming a solid electrolyte layer connected to the first active material layer, a second active material layer formation step of forming a second active material layer connected to the solid electrolyte layer, and a repair step of repairing a short-circuit defect produced between the first active material layer and the second active material layer by supplying a repair current between the first active material layer and the second active material layer.

A second aspect of the present invention is a method for testing an all solid-state lithium-ion rechargeable battery. The all solid-state lithium-ion rechargeable battery includes a base, a first active material layer formed on the base, a solid electrolyte layer connected to the first active material layer, and a second active material layer connected to the solid electrolyte active material layer. The testing method of the present invention includes a repair step of repairing a short-circuit defect produced between the first active material layer and the second active material layer by supplying a repair current between the first active material layer and the second active material layer.

DESCRPTION OF THE EMBODIMENTS

First Embodiment

One embodiment of the present invention will now be described with reference to FIGS. 1 to 4.

Figure 1:
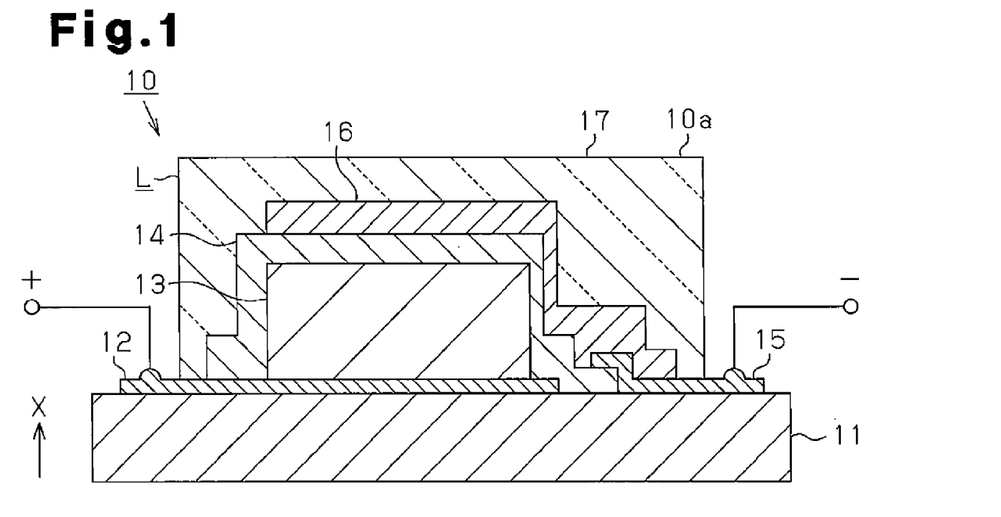
FIG. 1 is a cross-sectional view showing a main portion of an all solid-state lithium-ion rechargeable battery.

FIG. 1 is a cross-sectional view showing a main portion of an all solid-state lithium-ion rechargeable battery 10. The all solid-state lithium-ion rechargeable battery 10 includes a laminate L formed by different layers on a base 11.

The shape of the base 11 is not particularly limited. In the present embodiment, the base 11 may have the form of a plate, a sheet, a film, or a thin plate. Although the material of the base 11 is not particularly limited, glass, mica, alumina, metal, resin, and the like may be used.

A positive electrode collector layer 12 is stacked on a portion of the surface of the base 11. The positive electrode collector layer 12 is conductive and formed from a known material generally used as a collector. For example, molybdenum (Mo), nickel (Ni), chromium (Cr), aluminum (Al), copper (Cu), gold (Au), and vanadium (V) may be used.

A positive electrode active material layer 13 may be stacked as a first active material layer on the positive electrode collector layer 12. The material of the positive electrode active material layer 13 only needs to be a lithium transition metal compound capable of occluding and releasing lithium ions. For example, $LiCoO_2$, $LiNiO_2$, $LiMn_2$, $LiMn_2O_4$, $LiFePO_4$, $TiS_2$, and $LiM1_xM2_yO_z$ (where M1 and M2 are transition metals, and x, y, and z are any real numbers) may be used. Each of the above materials may be combined to form the positive electrode active material layer 13.

A solid electrolyte layer 14 is stacked on the positive electrode active material layer 13. The electrolyte layer 14 is formed from a known material used as a solid electrolyte layer and may be obtained, for example, by including a solute of a lithium salt, such as $LiPE_6$ and $LiClO_4$, in a polymeric material, such as $Li_3PO_4$, polyethylene oxide, polypropylene oxide, and polyethylene oxide derivative. An inorganic solid electrolyte such as $Li_2S$, $Li_3PO_4$, LiPON, or Li—Si—Al(P) composite oxide may be used. Further, each of the above materials may be combined to form the solid electrolyte layer 14.

A negative electrode collector layer 15 is stacked on an end of the solid electrolyte layer 14 and a portion in the surface of the base 11. The negative electrode collector layer 15 may be formed from the same material as the positive electrode collector layer 12 through the same manufacturing method.

Further, a negative electrode active material layer 16 is stacked as a second active material layer on most of the surface of the solid electrolyte layer 14 and a portion of the negative electrode collector layer 15. The negative electrode active material layer 16 only needs to be a material capable of occluding and releasing lithium ions. For example, a carbon material, such as graphite, coke, or a polymer sinter, C-Si composite material, metal lithium, an alloy of lithium and another metal, and a metal oxide or metal sulfide, such as $Nb_2O_5$, $TiO_2$, $SnO_2$, $Fe_2O_3$, and $SiO_2$ may be used. The above materials may be combined to form the negative electrode active material layer 16.

A protective layer 17 is stacked to cover a portion of the positive electrode collector layer 12, a portion of the solid electrolyte layer 14, a portion of the negative electrode collector layer 15, and the entire surface of the negative electrode active material layer 16. The material of the protective layer 17 is not particularly limited, and a known material may be used as the protective layer 17, such as polytetrafluoroethylene (PTFE) and silica.

Figure 2:
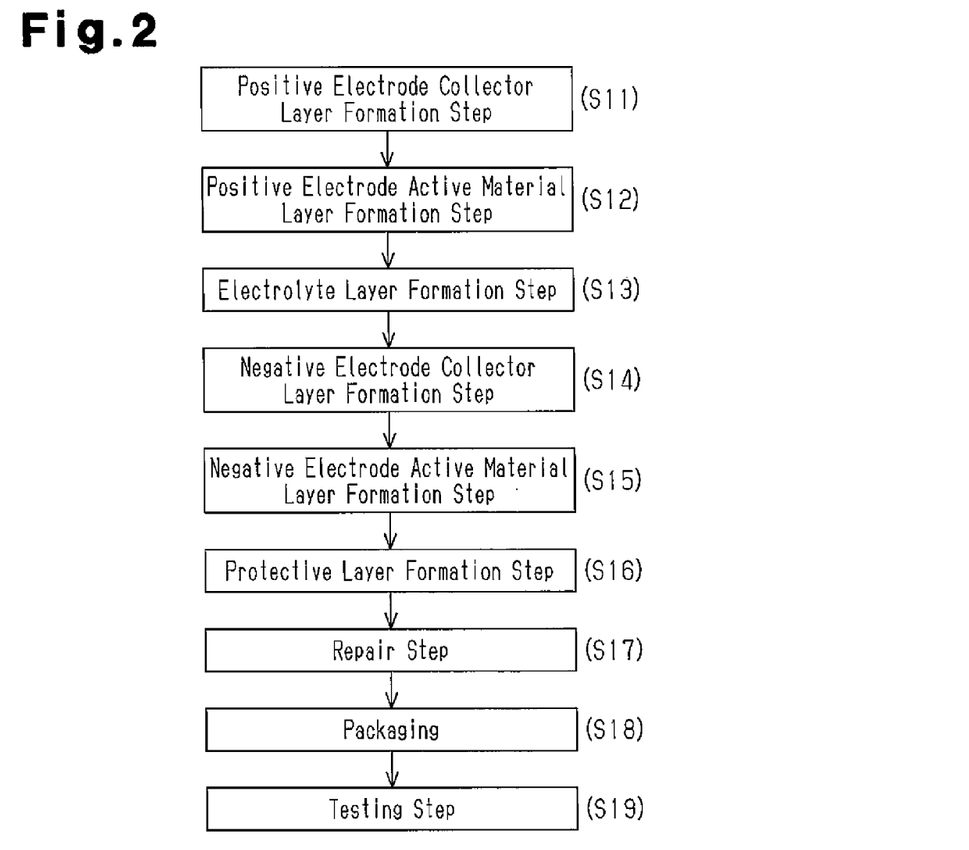
FIG. 2 is a flowchart showing a method for manufacturing an all solid-state lithium-ion rechargeable battery.

FIG. 2 is a flowchart showing a method for manufacturing the all solid-state lithium-ion rechargeable battery 10.

After preparing the base 11 for forming the laminate L, a positive electrode collector layer formation step (step S11) is performed. In this step, a known method is used to form the thin film of the positive electrode collector layer 12 on the base 11. In the present embodiment, the positive electrode collector layer 12 is formed by performing a sputtering process but may be formed through a process other than sputtering like a vapor deposition, such as physical vapor deposition (PVD) or chemical vapor deposition (CVD), such as thermal CVD.

When the electrode collector layer 12 is formed, a positive electrode active material layer formation step (step S12) serving as the first active material layer formation step is performed. In this step, the positive electrode active material layer 13 is formed on the positive electrode collector layer 12 by performing sputtering. Alternatively, another PVD process or CVD process may be performed to form the positive electrode active material layer 13. Further, a wet film formation process, such as screen printing, inkjet printing, and blasting, and a solidifying process, which is performed subsequently or simultaneously, of dehydration and de-medium, such as drying and sintering, may be performed to form the positive electrode active material layer 13. The present testing and repair method is applicable to an all solid-state lithium-ion rechargeable battery produced by performing such a wet manufacturing process.

Then, in an electrolyte layer formation step (step S13), the solid electrolyte layer 14 is formed to cover the positive electrode active material layer 13. The solid electrolyte layer 14 is formed through a sputtering process. However, in the same manner as the positive electrode collector layer 12, other PVD processes and CVD processes may be performed. Further, various types of printing and painting processes may be used.

When the electrolyte layer 14 is stacked, an electrode collector layer formation step (step S14) is performed. The negative electrode collector layer 15 is formed to cover the end of the solid electrolyte layer 14 and a portion of the surface of the base. The negative electrode collector layer 15 may be formed through the same process as the positive electrode collector layer 12.

When the negative electrode collector layer 15 is formed, a negative electrode active material layer formation step (step S15) serving as a second active material layer formation step is performed. In the same manner as the positive electrode active material layer 13, the negative electrode active material layer 16 may be formed by performing sputtering or other PCD processes and CVD processes. Further, various types of printing and painting processes may be used.

When the negative electrode active material layer 16 is formed, a protective layer formation step (step S16) is formed. The protective layer 17 is formed to cover a portion of the positive electrode collector layer 12, a portion of the electrolyte layer 14, a portion of the negative electrode collector layer 15, and the entire negative electrode active material layer 16. When the protective layer 17 is stacked, the laminate has a height of approximately 15 μm.

The laminate L, on which the protective layer 17 is formed, forms a single cell, and a repair step is performed on the cell (step S17). The repair step also function as a step for testing the charge and discharge characteristics of the battery before being shipped out of a factory.

Figure 3:
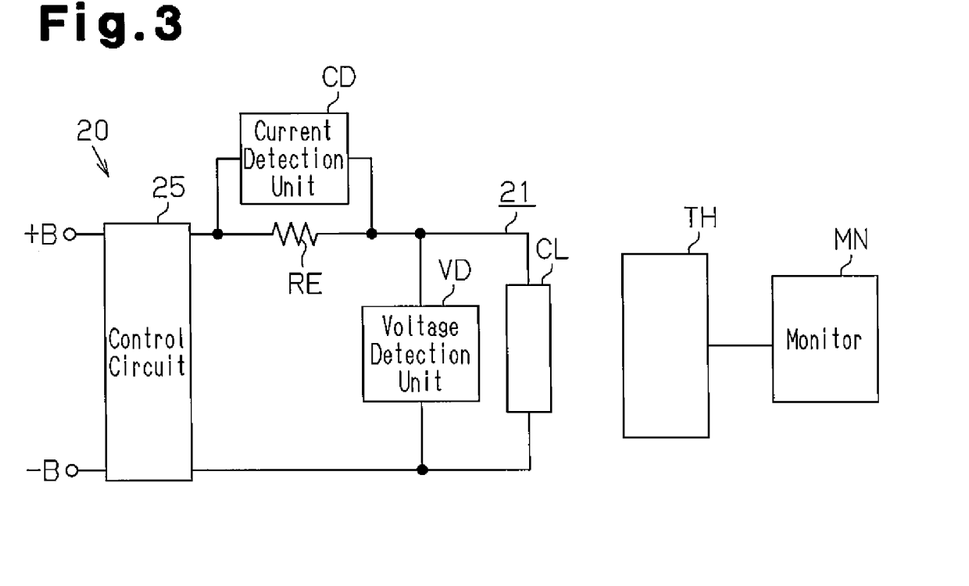
FIG. 3 is a schematic diagram of a testing system.

FIG. 3 is a schematic diagram of a testing system 20. The testing system 20 is a device for conducting tests on the cell prior to shipment. Generally, a lithium-ion rechargeable battery is charged and discharged to test the battery capacity and the like after the cell or battery is produced, and the testing system 20 is a device for conducting such a test. Batteries having an extremely low battery capacity including short-circuited batteries are eliminated as defective products.

The testing system 20 includes a charging circuit 21. The charging circuit 21 includes a control circuit 25, which is connected to a power supply. The control circuit 25 controls the value of the current supplied to a cell CL and switches operations between a mode for supplying constant current and charging the cell CL and a repair mode for supplying pulsed current to the cell CL and repairing a short-circuit. Further, the charging circuit 21 includes a known resistor element RE, which has a known resistance, a current detection unit CD, which detects the current flowing through the resistor element RE, a voltage detection unit VD, which is arranged in parallel to the cell CL. The current detection unit CD and the voltage detection unit VD feed detection values back to the control circuit 25.

Further, the testing system 20 includes a thermographer TH, which is arranged in a non-contact state with the charging circuit 21, and a monitor MN, which is connected to the thermographer TH. The thermographer TH detects the temperature distribution of the cell CL, and the monitor MN visualizes the temperature distribution as an image or the like.

Figure 4:
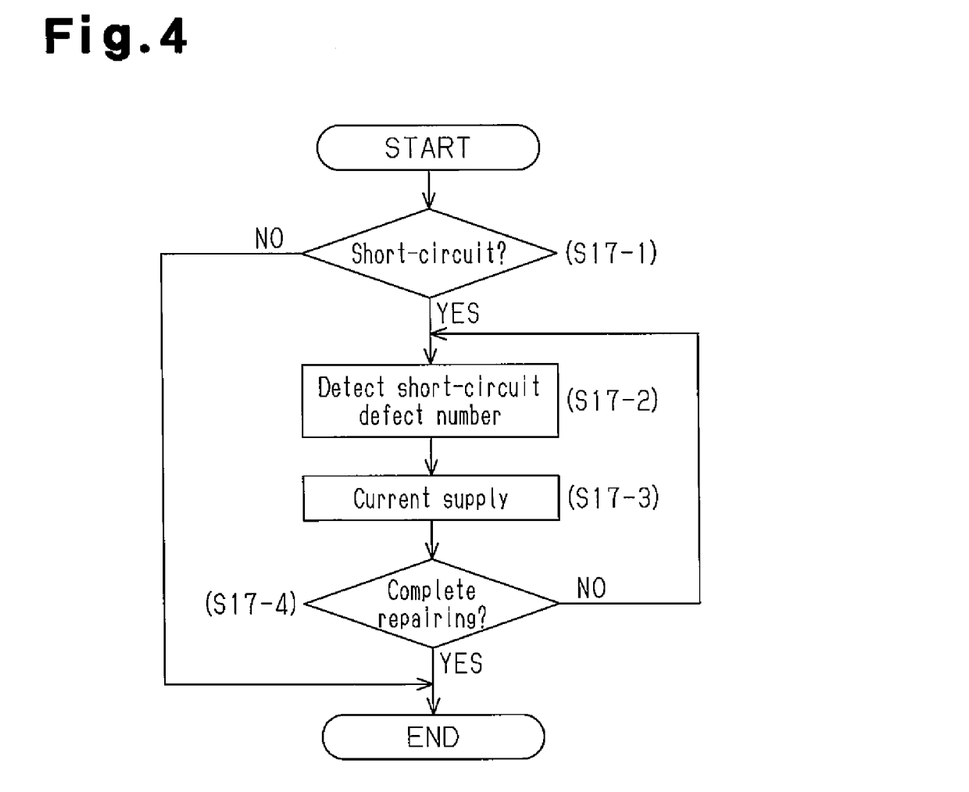
FIG. 4 is a flowchart of a repair step.

FIG. 4 shows the procedures of the repair step. First, the control circuit 25 supplies the cell CL with constant current from the charging circuit 21 to measure the battery capacity or the like and determine whether or not a short-circuit is occurring (step S17-1). Here, reverse bias may be applied to the cell CL, or forward bias may be applied to the cell CL. Further, although the level of a test current used to determine a short-circuit is not particularly limited, the test current may be less than 100 C, which is lower than the value of the current supplied as a repair current that will be described later. The unit "C" is the level of the current that charges the battery formed by a single cell CL from a non-charged state to a fully charged state in one hour (current rate (A; ampere). In other words, the current rate indicates the current value for discharging a charged capacitor in one hour until the current value becomes 0.

When the current detection unit CD detects a normal current, the control circuit 25 determines that a short-circuit is not occurring (NO in step S17-1) and returns to the normal testing to test the charging and discharging characteristics. This ends the short-circuit defect repair step.

When normal current is not detected and the occurrence of short-circuiting is determined (YES in step S17-1), the short-circuit defect is repaired. In the first embodiment, the control circuit 25 first supplies test current for detecting the number of defects and detects the short-circuit defect number with the thermographer TH (step S17-2). For example, the control circuit 25 applies a reverse bias to the cell CL and supplies a test current that is less than 100 C. The temperature distribution at the side of the upper surface 10a of the laminate L is measured by detecting the intensity of infrared rays or the like emitted from the laminate L. The number of temperature increase portions where the temperature locally increased in the laminate L is checked by viewing the monitor MN, which is connected to the thermographer TH. The number of temperature increase portions is specified as the short-circuit defect number N. More specifically, when the laminate L includes a defect, such as a pinhole and a crack, the defect electrically connects the positive electrode collector layer 12 and the negative electrode collector layer 15 thereby producing a short-circuit. Current concentrates at the short-circuited location and increases the temperature as compared to a defect-free location. Thus, the number of temperature increase portions detected by the thermographer TH is substantially the same as the number of short-circuit defects. When detecting the number of short-circuit defects, a forward bias may be applied to the cell CL.

Then, the cell CL is supplied with a repair current (step S17-3). The repair current is specified by an electric amount (ampere hour; Ah), that is, current value (A)·pulse time (sec). Preferably, the current value of the repair current is 100 C or greater and 10000 C or less for each short-circuit defect. Further, the control circuit 25 supplies only one pulse of a pulsed repair current having a value in the above range for each short-circuit defect. In other words, the control circuit 25 supplies only one pulse of a repair current having a value obtained by multiplying a current value of 100 C or greater and 10000 C or less by the short-circuit defect number N. As a result, current concentrates at each short-circuit defect portion. The heat generated by the concentration of current converts a conduction path of each short-circuit defect portion to an insulator and thereby eliminates the short-circuit defect. In this embodiment, the pulsed repair current is supplied for only one pulse. However, the repair current may be supplied for multiple pulses. In this case, the duty ratio may be 0.5 to 0.1.

When the value of the repair current supplied to the cell CL is less than 100 C, the elimination of a short-circuit defect portion may not be ensured. When the current value of the repair current exceeds 10000 C, a large load is applied to the cell CL. This increases the temperature of the battery and causes deformation that is likely to lose the battery functions.

Even when the current value is 10000 C or less, load is applied to the cell CL. Thus, it is preferable that the number of pulses of the supplied repair current be small such as one pulse. This suppresses deterioration of the battery functions.

Generally, in a layer formed by a sputtering process, particles are generated more frequently than a layer formed by a CVD process. Thus, in the all solid-state lithium-ion rechargeable battery 10 formed by a sputtering process, short-circuit defects occur more frequently than an all solid-state lithium-ion rechargeable battery formed by a CVD process. In a manufacturing process in which the occurrence frequency of short-circuit defects is low, the current value of the repair current supplied between the positive electrode active material layer 13 and the negative electrode active material layer 16 may be increased in a stepped manner. By checking for short-circuit defects whenever changing the current value of the repair current, damage to the all solid-state lithium-ion rechargeable battery can be reduced. In contrast, in a manufacturing method in which the occurrence frequency of short-circuit defects is high, when performing a repair step that increases the current value of the repair current in a stepped manner as described above, the current value of the repair current is changed more frequently. Thus, in the repair step, by supplying only one pulse of the repair current, the time of the repair step can be reduced.

When the repair current has been supplied, the control circuit 25 determines whether or not the repairing has been completed (step S17-4). More specifically, when the repair current is supplied once, short-circuit defects are completely eliminated most of the time. However, for example, when there are many short-circuit defects, some of the short-circuit defects may not be eliminated. In such a case, in the same manner as step S17-1, the cell CL is supplied with a test current that is less than 100 C. The control circuit 25 detects the current value with the current detection unit CD. When current flows in a normal manner, the control circuit 25 determines that the repairing has been completed (YES in step S17-4) and ends the testing step.

When current is not normally flowing in the circuit (NO in step S17-4), the control circuit 25 returns to step 517-2, detects the number of short-circuit defects, and supplies the repair current (step S17-3). Then, until the repairing is completed, the control circuit 25 repeats the detection of the short-circuit number (step S17-2) and the supply of the repair current (step S17-3).

When determined in step S17-4 that repairing has been completed and the repairing of the laminate L is completed, one or more cells formed by the laminate L are packaged (step S18). For example, when using a plurality of cells, the cells are connected in parallel or in series, and the connected cells are accommodated in a case of plastic or the like together with a thermistor and a protective element such as a temperature fuse to produce a battery package. In this manner, the cell CL of which short-circuit defects have been repaired is used to form a package. This avoids a case in which, for example, when short-circuiting is found after forming the package, the cells CL connected in series or in parallel to the cell CL having a short-circuit are disposed of or the battery package is dismantled to remove the defective cells CL.

The packaged all solid-state lithium-ion rechargeable battery 10 undergoes a testing step before being shipped out of the factory (step S19). For example, charging and discharging under a high temperature, charging and discharging under room temperature, and measurement of the battery characteristics may be performed. In this case, the battery package is connected to and charged by the charging circuit 21 of the testing system 20. The repetition of charging and discharging in this manner allows for activation of an active material. After the charging and discharging is repeated for a predetermined number of times, the charged all solid-state lithium-ion rechargeable battery 10 is spontaneously discharged. Then, the voltage subsequent to discharging is measured. When the voltage difference is large, it is determined that the battery is defective. Accordingly, the charging circuit 21 used here may be used in the repair step (step S17). Thus, there is no need for providing a separate repair circuit.

The above embodiment has the advantages described below.

(1) In the above embodiment, the method for manufacturing the all solid-state lithium-ion rechargeable battery 10 includes the positive electrode active material layer formation step (step S12) that forms the positive electrode active material layer 13 on the base 11, and the electrolyte layer formation step (step S13) that forms the solid electrolyte layer 14 connected to the positive electrode active material layer 13. The method further includes the negative electrode active material layer formation step (step S15) that forms the negative electrode active material layer 16 connected to the solid electrolyte layer 14. Further, the method includes the repair step (step S17) that supplies pulsed repair current between the positive electrode active material layer 13 and the negative electrode active material layer 16 and repairs short-circuit defects produced between the positive electrode active material layer 13 and the negative electrode active material layer 16. Thus, even when a short-circuit defect occurs during manufacturing, the repair step eliminates short-circuits. Accordingly, the yield is not affected by such short-circuit defects.

(2) In the above embodiment, when test current for detecting the number of defects is supplied to the laminate L, the temperature distribution of the laminate L is measured with the thermographer TH. The number of temperature increase portions, where the temperature locally increases in the laminate L compared to before the supply of current, is detected as the short-circuit defect number N. Further, the laminate L is supplied with repair current having a level of 100 C or greater and 10000 C or less for each short-circuit defect to insulate metal at the location where short-circuit defects occur. In this manner, the current is proportional to the number of short-circuit defects. This prevents the battery functions from being lost. By setting the current value of the repair current in the above range, short-circuit defects may be sufficiently repaired and battery functions are not lost.

(3) In the above embodiment, the positive electrode active material layer 13, the solid electrolyte layer 14, and the negative electrode active material layer 16 are formed in sputtering processes. In the repair step, the repair current is supplied for only one pulse. Generally, in a layer formed by a sputtering process, particles are generated more frequently than a layer formed by a CVD process. Thus, in the all solid-state lithium-ion rechargeable battery 10 formed by a sputtering process, short-circuit defects occur more frequently that an all solid-state lithium-ion rechargeable battery formed by a CVD process. In a manufacturing process in which the occurrence frequency of short-circuit defects is low, the current value of the repair current supplied between the positive electrode active material layer 13 and the negative electrode active material layer 16 may be increased in a stepped manner. By checking for short-circuit defects whenever changing the current value of the repair current, damage to the all solid-state lithium-ion rechargeable battery can be reduced. In contrast, in a manufacturing method in which the occurrence frequency of short-circuit defects is high, when performing a repair step that increases the current value of the repair current in a stepped manner as described above, the current value of the repair current is changed more frequently. Thus, in the repair step, by supplying only one pulse of the repair current, the time of the repair step can be reduced.

(4) In the above embodiment, the occurrence of short-circuit defects is determined based on the characteristics when the all solid-state lithium-ion rechargeable battery 10 is charged and discharged. Thus, the testing prior to shipment and the repairing of short-circuit defects may be performed in the same step. This allows for the repairing step to be shortened.

Second Embodiment

A second embodiment of the present invention will now be described. The second embodiment differs from the first embodiment only in the testing process. Thus, similar parts will not be described in detail.

In the first embodiment, the number of short-circuit defects is estimated to supply only one pulse of the repair current. In the second embodiment, the number of short-circuit defects is not estimated, and the current value of the repair current is increased in a stepped manner to repair short-circuit defects. That is, step S17-2 described above is omitted. Accordingly, the thermographer TH and the monitor MN of the testing system 20 may be omitted, and a general testing system that tests the battery capacity or the like may be used. Further, in the second embodiment, since temperature changes are not detected by the thermographer TH, the all solid-state lithium-ion rechargeable battery 10 that has undergone packaging may be subject to tests.

Figure 5:
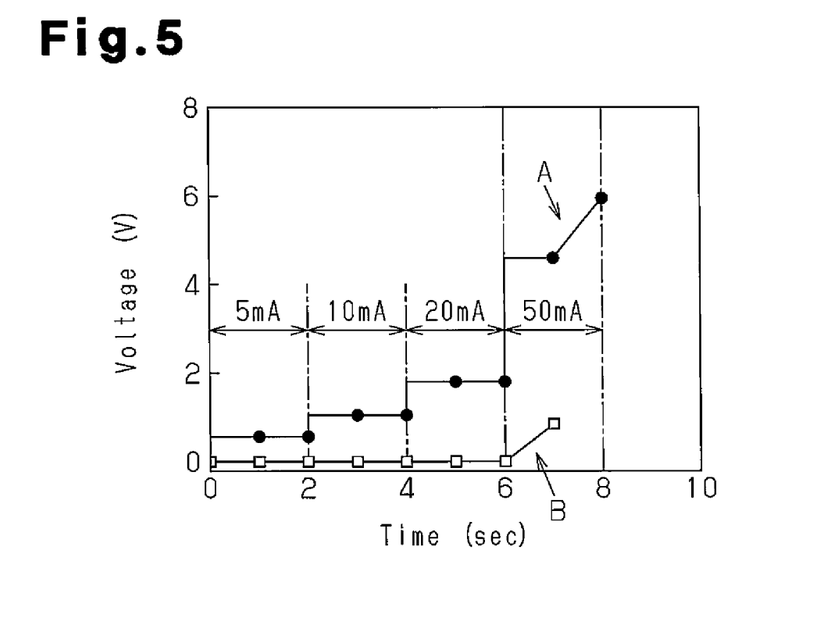
FIG. 5 is a graph showing voltage changes in the battery when supplying a short-circuit repair current.

Step S17-1 shown in FIG. 4 is performed in a normal manner. When determined that there is a short-circuit (YES in step S17-1), in step S17-3, constant current is supplied while increasing current value of the repair current in a stepped manner. More specifically, as shown in FIG. 5, the level of the constant current supplied to the cell CL is increased in a stepped manner, for example, 5 mA, 10 mA, 20 mA, and 50 mA. Further, the time during which constant current is supplied is, for example, two seconds for each level.

In FIG. 5, the upper part of the drawing shows a voltage change A when measuring the voltage of a circuit including a shunt resistor, and the lower part of the drawing shows a voltage change B when detecting an open end voltage of the cell CL. When measuring a voltage change in the circuit including the shunt resistor, the measured voltage increases as the current value of the repair current increases in a stepped manner. This is because of the shunt resistor and does not indicate repairing of short-circuit defects. Further, as shown in FIG. 5, the open end voltage does not increase when the constant current value is in the range from 5 mA to 20 mA. This is because the range from 5 mA to 20 mA indicates that short-circuit defects have not been repaired.

When a constant current of 50 mA is supplied, after just one second, the cell unit voltage and the open end voltage suddenly increase. This shows that short-circuit defects have been repaired. However, as described above, when increasing the current value in a stepped manner, the shunt resistor increases the cell unit voltage. In contrast, when increasing the current value in a stepped manner, the value of the open end voltage does not change before short-circuit defects are repaired and suddenly increases when short-circuit defects are repaired. Thus, when measuring the open end voltage, there is a large voltage difference before and after short-circuits are repaired. For this reason, the determination of the short-circuit repairing timing using the open end voltage is more favorable since this ensures that short-circuit defects are clearly and easily repaired.

The second embodiment has the advantages described below.

(5) In the second embodiment, the repairing completion timing is determined by detecting the open end voltage of the all solid-state lithium-ion rechargeable battery 10. Thus, voltage changes after the completion of repairing are clearer than when detecting the voltage of a circuit including a shunt resistor or the like. This accurately and easily determines the timing for ending defect repairing.

(6) In the second embodiment, the value of the repairing current supplied between the positive electrode active material layer 13 and the negative electrode active material layer 16 is increased in a stepped manner. Thus, even when the number of short-circuits is not known, by increasing the current in a stepped manner, the minimum current value allowing for the short-circuit defects to be repaired is reached. Thus, damages to the battery are reduced while ensuring that short-circuit defects are repaired.

Each of the above embodiments may be modified as described below.

Figure 6:
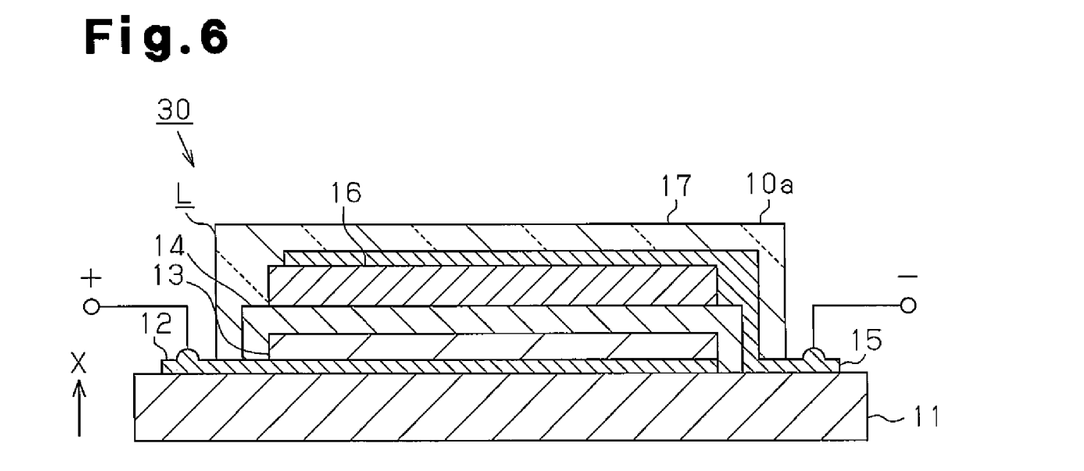
FIG. 6 is a cross-sectional view showing a main portion of an all solid-state lithium-ion rechargeable battery in another example.

In the above embodiments, the all solid-state lithium-ion rechargeable battery 10 may have a structure other than that shown in FIG. 1. For example, an all solid-state lithium-ion rechargeable battery may have the structure shown in FIG. 6. The structure of an all solid-state lithium-ion rechargeable battery 30 in FIG. 6 is basically the same as the structure of the all solid-state lithium-ion rechargeable battery 10 shown in FIG. 1 but the two differ in that the negative electrode collector layer 15 is also stacked on the negative electrode active material layer. In the same manner as the battery structure of FIG. 1, the negative electrode collector layer 15 extends to the exterior in contact with the electrolyte layer 14 and the negative electrode active material layer 16. When manufacturing the all solid-state lithium-ion rechargeable battery 30 of FIG. 6, in the manufacturing method of FIG. 2, the order for performing the negative electrode collector layer formation step (step S14) and the negative electrode active material layer formation step (step S15) may be reversed. More specifically, after forming the negative electrode active material layer 16, the negative electrode collector layer 15 is formed to contact the electrolyte layer 14 and the negative electrode active material layer 16 and substantially cover the surface of the negative electrode active material layer 16.

In the above embodiments, the positive electrode collector layer 12, the positive electrode active material layer 13 serving as the first active material layer, the electrolyte layer 14, the negative electrode collector layer 15, and the negative electrode active material layer 16 serving as the second active material layer are sequentially stacked on the base 11. However, the stacking order is not limited. For example, a negative electrode collector layer, a negative electrode active material layer serving as the first active material layer, an electrolyte layer, a positive electrode collector layer serving as the second active material layer, and a positive electrode active material layer may be sequentially stacked on the base 11. Further, the stacking state is not limited to the form of FIG. 1, and each layer of the all solid-state lithium-ion rechargeable battery 10 may be stacked to cover the upper surface of the lower layer. In the same manner, in the battery structure shown in FIG. 6, the order of the layers stacked on the base 11, that is, the order of the positive electrode and the negative electrode, may be reversed.

In the above embodiments, the same charging circuit 21 is used as the circuit for the repairing step and the circuit for the testing step. However, a separate circuit may be arranged for each step.

In the above embodiments, the thermographer TH is used to detect the short-circuit defect number N and supply the repairing current of 100 C or greater and 10000 C or less for each short-circuit defect. However, the short-circuit defect number detection step may be eliminated. More specifically, when the occurrence of a short-circuit is determined, the step for supplying only one pulse having a current value of 100 C or greater and 10000 C or less and the step for determining whether or not a short-circuit has been eliminated may be repeated.

The method for forming the positive electrode collector layer 12, the positive electrode active material layer 13, the solid electrolyte layer 14, the negative electrode collector layer 15, and the negative electrode active material layer 16 is not particularly limited. For example, a dry film formation process (sputtering, vapor deposition, CVD, PLD, electronic beam vapor deposition, and the like) and a wet film formation process (screen printing, offset printing, inkjet printing, spray coating, and the like) may be performed.

The invention claimed is:

1. A method for manufacturing an all solid-state lithium-ion rechargeable battery, the method comprising: forming a first active material layer on a base; forming a solid electrolyte layer connected to the first active material layer; forming a second active material layer connected to the solid electrolyte layer; and repairing a short-circuit defect produced between the first active material layer and the second active material layer by supplying a repair current between the first active material layer and the second active material layer, wherein in the repairing, only one pulse of the repair current is supplied; wherein the repairing includes supplying current, having a value obtained by multiplying a repair current value of 100 C or greater and 10000 C or less for each short-circuit defect by an estimated short-circuit defect number, to between the first active material layer and the second active material layer.

2. A method for manufacturing an all solid-state lithium-ion rechargeable battery, the method comprising: forming a first active material layer on a base; forming a solid electrolyte layer connected to the first active material layer; forming a second active material layer connected to the solid electrolyte layer; and repairing a short-circuit defect produced between the first active material layer and the second active material layer by supplying a repair current between the first active material layer and the second active material layer, wherein in the repairing, only one pulse of the repair current is supplied; wherein the repairing includes determining occurrence of the short-circuit defect based on characteristics when charging and discharging the all solid-state lithium-ion rechargeable battery.

3. A method for manufacturing an all solid-state lithium-ion rechargeable battery, the method comprising: forming a first active material layer on a base; forming a solid electrolyte layer connected to the first active material layer; forming a second active material layer connected to the solid electrolyte layer; and repairing a short-circuit defect produced between the first active material layer and the second active material layer by supplying a repair current between the first active material layer and the second active material layer, wherein in the repairing, only one pulse of the repair current is supplied; wherein the repairing includes determining whether or not repairing of the short-circuit defect has been completed by detecting an open end voltage of the all solid-state lithium-ion rechargeable battery.

4. A method for manufacturing an all solid-state lithium-ion rechargeable battery, the method comprising: forming a first active material layer on a base; forming a solid electrolyte layer connected to the first active material layer; forming a second active material layer connected to the solid electrolyte layer; and repairing a short-circuit defect produced between the first active material layer and the second active material layer by supplying a repair current between the first active material layer and the second active material layer, wherein in the repairing, only one pulse of the repair current is supplied; wherein the repairing includes: measuring a temperature distribution of a laminate including the first active material layer and the second active material layer when supplying a test current of less than 100 C between the first active material layer and the second active material layer, and detecting a number of temperature increase portions where the temperature locally increased in the laminate compared to before the supply of the test current, in order to detect the number of short-circuit defects.

5. A method for manufacturing an all solid-state lithium-ion rechargeable battery, the method comprising:
   forming a first active material layer on a base;
   forming a solid electrolyte layer connected to the first active material layer;
   forming a second active material layer connected to the solid electrolyte layer; and
   repairing a short-circuit defect produced between the first active material layer and the second active material layer by supplying a repair current between the first active material layer and the second active material layer;
   wherein the repairing includes increasing in steps a value of the repair current supplied between the first active material layer and the second active material layer.

6. A method for testing an all solid-state lithium-ion rechargeable battery including a base, a first active material layer formed on the base, a solid electrolyte layer connected to the first active material layer, and a second active material layer connected to the solid electrolyte active material layer, the method comprising: repairing a short-circuit defect produced between the first active material layer and the second active material layer by supplying a repair current between the first active material layer and the second active material layer, wherein in the repairing, only one pulse of the repair current is supplied; wherein the repairing includes supplying current, having a value obtained by multiplying a repair current value of 100 C or greater and 10000 C or less for each short-circuit defect by an estimated short-circuit defect number, to between the first active material layer and the second active material layer.

7. A method for testing an all solid-state lithium-ion rechargeable battery including a base, a first active material layer formed on the base, a solid electrolyte layer connected to the first active material layer, and a second active material layer connected to the solid electrolyte active material layer, the method comprising: repairing a short-circuit defect produced between the first active material layer and the second active material layer by supplying a repair current between the first active material layer and the second active material layer, wherein in the repairing, only one pulse of the repair current is supplied; wherein the repairing includes determining occurrence of the short-circuit defect based on characteristics when charging and discharging the all solid-state lithium-ion rechargeable battery.

8. A method for testing an all solid-state lithium-ion rechargeable battery including a base, a first active material layer formed on the base, a solid electrolyte layer connected to the first active material layer, and a second active material layer connected to the solid electrolyte active material layer, the method comprising: repairing a short-circuit defect produced between the first active material layer and the second active material layer by supplying a repair current between the first active material layer and the second active material layer, wherein in the repairing, only one pulse of the repair current is supplied; wherein the repairing includes determining whether or not repairing of the short-circuit defect has been completed by detecting an open end voltage of the all solid-state lithium-ion rechargeable battery.

9. A method for testing an all solid-state lithium-ion rechargeable battery including a base, a first active material layer formed on the base, a solid electrolyte layer connected to the first active material layer, and a second active material layer connected to the solid electrolyte active material layer, the method comprising: repairing a short-circuit defect produced between the first active material layer and the second active material layer by supplying a repair current between the first active material layer and the second active material layer, wherein in the repairing, only one pulse of the repair current is supplied; wherein the repairing includes: measuring a temperature distribution of a laminate including the first active material layer and the second active material layer when supplying a test current of less than 100 C between the first active material layer and the second active material layer, and detecting a number of temperature increase portions where the temperature locally increased in the laminate compared to before the supply of the test current, in order to detect the number of short-circuit defects.

10. A method for testing an all solid-state lithium-ion rechargeable battery including a base, a first active material layer formed on the base, a solid electrolyte layer connected to the first active material layer, and a second active material layer connected to the solid electrolyte active material layer, the method comprising:
    repairing a short-circuit defect produced between the first active material layer and the second active material layer by supplying a repair current between the first active material layer and the second active material layer;
    wherein the repairing includes increasing in steps a value of the repair current supplied between the first active material layer and the second active material layer.

* * * * *